May 16, 1967 C. D. TODD 3,320,433

NEGATIVE RESISTANCE CIRCUIT

Filed June 1, 1960 2 Sheets-Sheet 1

INVENTOR.
CARL D. TODD,
BY
Walter J. Adam
ATTORNEY.

INVENTOR.
CARL D. TODD,
BY
Walter J. Adam
ATTORNEY.

3,320,433

NEGATIVE RESISTANCE CIRCUIT

Carl David Todd, Costa Mesa, Calif., assignor to Hughes Aircraft Company, Culver City, Calif., a corporation of Delaware Filed June 1, 1960, Ser. No. 33,249
7 Claims. (Cl. 307—88.5)

This invention relates to negative resistance circuits and particularly to an improved negative resistance circuit having an N-type voltage versus current characteristic useful in devices such as bistable circuits.

Many electronic circuits and devices exhibit a negative resistance, that is, at least a portion of the voltage-current characteristic of the circuit provides a decreasing current for an increasing voltage or a decreasing voltage for an increasing current. Customarily negative resistance devices are divided into two major classes referred to as N-type or S-type which respectively form a characteristic curve shaped similar to an N or an S when voltage is the vertical axis and current is the horizontal axis. The N-type of negative resistance devices are current stable as only one voltage exists for a specified current, and the S-type of negative resistance devices are voltage stable as only one valve of current exists when the voltage is specified. As is well known, certain devices require a current stable operation while other devices require a voltage stable operation. For example, low frequency relaxation oscillators using S-type negative resistances require rather large inductances, making an N-type device more suitable than an S-type device.

Some typical devices that have an N-type characteristic are gaseous discharge tubes, the common base configuration of the point contact transistor when utilizing the emitter-base terminals and the silicon unijunction transistor. Typical devices having an S-type characteristic are the vacuum tube tetrode, as used in the Dynatron oscillator, the point contact transistor in a common emitter configuration when utilizing the base-emitter terminals and the tunnel diode.

Tunnel diodes which are characteristically S-type devices have the advantages of a high frequency response and of high speed so as to respond to trigger pulses of extremely short duration, but have the disadvantage that the output voltage is quite low. A transistor has the advantage of operating at a relatively high voltage level but its ability to respond to short trigger pulses is substantially less than that of tunnel diodes. Also, to form a bistable memory element, two transistors are normally required. A combination of a tunnel diode and a transistor in such a manner as to take advantage of the desirable features of both devices to form a device useful, for example, in bistable memory circuits would be very advantageous to the art.

It is therefore an object of this invention to provide a simplified and high speed bistable memory circuit.

It is further object of this invention to provide a simplified negative resistance circuit that combines the characteristics of tunnel diodes and of transistors to provide high speed operation at a relatively high voltage level.

It is a still further object of this invention to provide a circuit having an N-type characteristic utilizing a tunnel diode having an S-type characteristic.

It is another object of this invention to provide improved bistable devices capable of being triggered from one state to the other when operating either with two or three input terminals.

Briefly, in accordance with this invention a bistable circuit is provided for developing an N-type negative resistance characteristic, that is, a characteristic where only one voltage may exist for a specified current. A tunnel diode having an S-type characteristic, that is, a characteristic where only one current value may exist for a specified voltage, is coupled in series with a resistor. The tunnel diode and the resistor are coupled across the input terminals for controlling the potential applied to the base of a transistor.

The circuit is stable in a first region of operation where the current through the tunnel diode is less than the peak current thereof and stable in a second region when the current through the tunnel diode exceeds the valley current therof. In one arrangement, trigger pulses are applied to one of the input terminals so as to instantaneously change the effective load and cause the tunnel diode and transistor combination to shift to its opposite state. The transistor is either conductive or non-conductive so as to develop a bistable output voltage. In another arrangement trigger pulses are applied directly to the tunnel diode to instantaneously shift the characteristics of the tunnel diode and the composite circuit characteristics so that the transistor is either conductive or non-conductive. Thus, a bistable output voltage is developed. Another arrangement in accordance with this invention utilizes a current bias source to control the tunnel diode so as to increase the switching efficiency of the circuit.

The novel features of this invention, as well as the invention itself, both as to its organization and method of operation, will best be understood from the accompanying description taken in connection with the accompanying drawings in which.

Figures 1, 2, 3, 4:
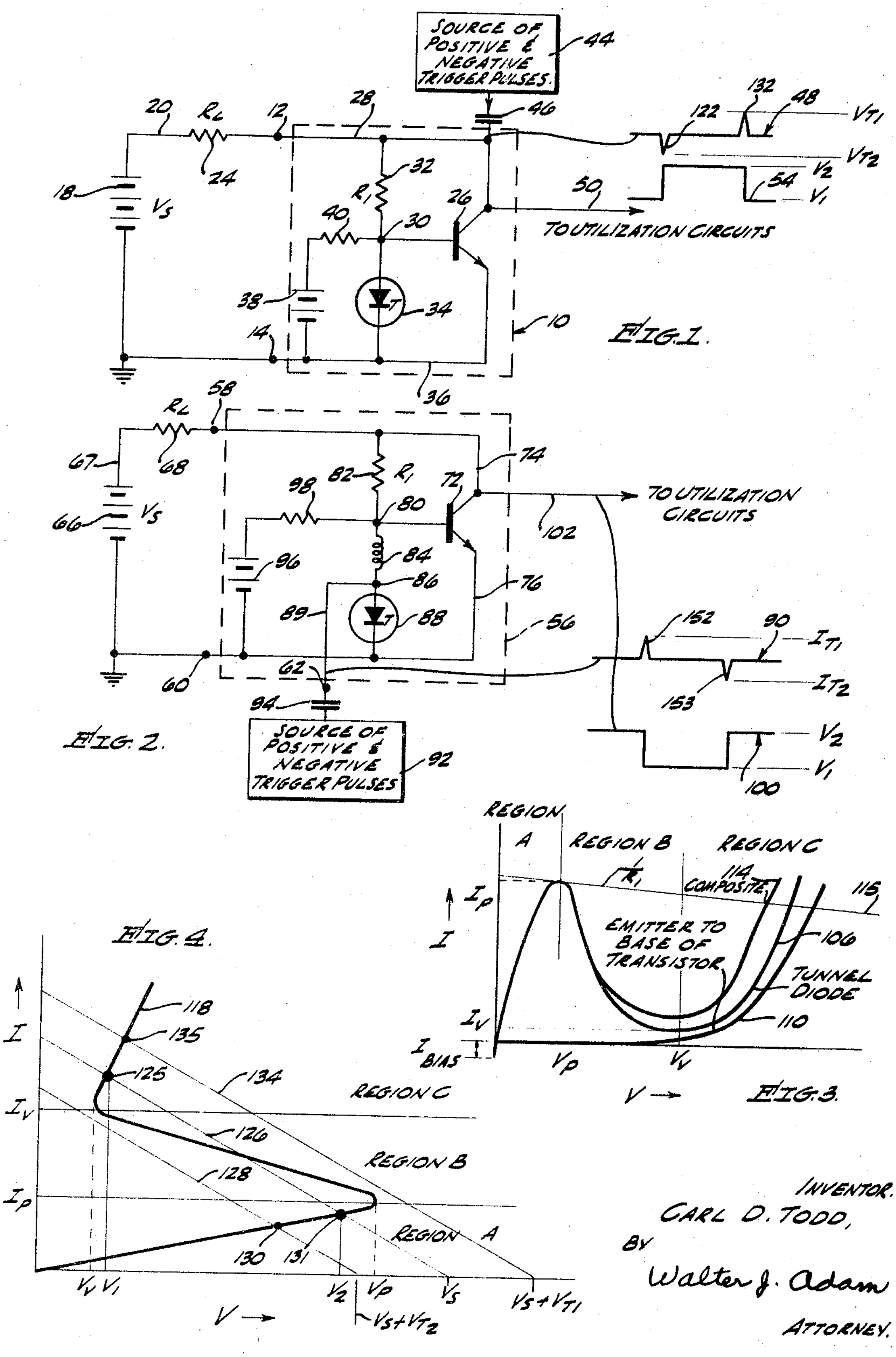
FIG. 1 is a schematic circuit diagram of a bistable circuit utilizing the negative resistance circuit in accordance with this invention with a triggering arrangement coupled to one of the two input terminals.
FIG. 2 is a schematic circuit diagram of a bistable circuit utilizing the negative resistance circuit in accordance with this invention with the trigger signals applied to a third input terminal.
FIG. 3 is a graph of current versus voltage for explaining the negative resistance characteristics of portions of the circuit of FIG. 1.
FIG. 4 is a graph of current versus voltage showing the operating characteristics of the bistable circuit of FIG. 1.

Referring first to FIG. 1 which is a schematic circuit diagram of one arrangement of the bistable circuit in accordance with this invention, it may be seen that the arrangement includes a negative resistance circuit 10 having a first input terminal 12 and a second input terminal 14, the latter of which may be coupled to ground. A potential source 18, which may be a battery providing a voltage of $V_S$, has a negative terminal coupled to ground and a positive terminal coupled through a lead 20 to a load resistor 24 having a value $R_L$ that causes the battery 18 to operate substantially as a current source. The negative resistance circuit 10 includes a transistor 26 of the n-p-n type having a collector coupled to the terminal 12 through a lead 28 and an emitter coupled through a lead 36 to the ground terminal 14. The base of the transistor 26 is coupled to a junction point 30 which, in turn, is coupled to the lead 28 through a resistor 32 having a value $R_1$. The junction 30 is also coupled to the anode end of a tunnel diode 34, the cathode end of which is coupled to the lead 36 which, in turn, is coupled to the terminal 14. As is well known in the art, the tunnel diode 34 is a single p-n junction device that displays a negative resistance in the forward biased region of its characteristic curve.

Its primary mechanism of operation is quantum mechanical tunneling of electrons through the p-n junction. This tunneling of electrons occurs approximately at the speed of light, thus providing operation in a frequency range far in excess of that for which the conventional transistors may be utilized.

To supply a bias potential to the tunnel diode 34, a current source is provide including a battery 38 having a negative terminal coupled to the lead 36 and a positive terminal coupled through a resistor 40 to the junction point 30. For triggering of the bistable circuit a source of positive and negative trigger pulses 44 is provided coupled through a coupling capacitor 46 to the lead 28. The trigger pulses are both positive and negative as indicated by a waveform 48. A signal having two voltage levels is, as shown by a waveform 54, developed at the collector of the transistor 26 and applied through a lead 50 to utilization circuits (not shown). It is to be noted that in the arrangement of FIG. 1, the trigger pulses of the waveform 48 are effectively applied to the terminal 12 so that a two terminal device is provided. As will be explained in further detail subsequently, the bias current source of the battery 38 and the resistor 40 is not required for the basic operation of the circuit but improves the efficiency of the switching action.

Referring now to FIG. 2, the bistable circuit, in accordance with this invention, utilizes a different trigger arrangement than that of FIG. 1. A negative resistance circuit 56 having a different trigger arrangement than that of FIG. 1 is shown in FIG. 2 to have first and second input terminals 58 and 60 and a third trigger input terminal 62, with the terminal 60 being grounded. A potential source 66 such as a battery having a value $V_S$ is provided with a negative terminal coupled to ground and with its positive terminal coupled through a lead 67 and through a load resistor 68 to the terminal 58. The load resistor 68, which has a value $R_L$, serves to convert the battery 66 substantially to a current source, as will be explained subsequently.

The negative resistance circuit 56 includes a transistor 72 of the n-p-n type having a collector coupled through a lead 74 to the terminal 58. The transistor 72, also, has an emitter coupled through a lead 76 to the terminal 60 and a base coupled to a junction point 80. A series path is provided from the lead 74 through a resistor 82 to the junction point 80 and through an isolation inductor 84 to a junction point 86 which, in turn, is coupled to the anode end of a tunnel diode 88. The cathode end of the tunnel diode 88 is coupled to the lead 76, with the tunnel diode having characteristics similar to the tunnel diode 34 of FIG. 1. For triggering the tunnel diode with a signal having a lower amplitude level than in the arrangement of FIG. 1, the junction point 86 is coupled to the terminal 62 through a lead 89. A source of positive and negative trigger pulses 92 is coupled to the terminal 62 through a coupling capacitor 94 to provide trigger pulses of a waveform 90. For biasing the tunnel diode 88, a current source is provided including a battery 96 having a negative terminal coupled to the lead 76 and a positive terminal coupled through a resistor 98 to the junction point 80. Similar to the circuit of FIG. 1, the current source including the battery 96 and the resistor 98 are not essential for operation of the circuit but improve the efficiency of the switching action, as will be explained in further detail subsequently. Signals having a first and a second state as shown by a waveform 100 are applied from the collector of the transistor 72 through a lead 102 to utilization circuits (not shown). It is to be understood that the n-p-n type transistors in FIGS. 1 and 2 are shown only as an example and that p-n-p type transistors may be utilized within the scope of this invention by reversing the polarities of the circuits.

For further explaining the operation of the circuit of FIG. 1, a curve 106 of FIG. 3 shows the voltage versus current characteristics of the tunnel diode 34 which is a typical S-type negative resistance characteristic curve. The current voltage axes of FIG. 3 and of the other graphs of this application have been reversed for ease of description. The curve 106 may be divided into a region A in which the voltage across the tunnel diode 34 is increasing with current up to the peak current $I_p$, a region B which exhibits a negative resistance characteristic, that is, a decreasing current for increasing voltage, and a region C with a voltage across the tunnel diode greater than the valley voltage $V_v$ in which the current increases with increasing voltage. A curve 110 shows the voltage-current characteristic of the emitter to base of the transistor 26 with an increasing current as the voltage increases. A composite curve 114 is a combination of curves 106 and 110 and shows the combined characteristics of the tunnel diode and of the emitter to base of the transistor 26 in the arrangement of FIG. 1. A load line 115 for the transistor 26 input and the tunnel diode 34 is shown in FIG. 3 having a slope $1/R_1$.

A curve 118 of FIG. 4 shows the composite characteristics of the negative resistance circuit 10 between the terminals 12 and 14, which includes regions A, B and C corresponding to the regions A, B and C of FIG. 3. In region A of FIG. 4, as current through the terminal 12 increases and current increases through the tunnel diode 34, the voltage between the terminals 12 and 14 increases to the peak voltage $V_p$. In region B as the current increases from a peak current $I_p$ to the valley curent $I_v$ the voltage $V_p$ decreases to the valley voltage $V_v$, thus constituting the negative resistance region. In region C as the current increases from the valley current $I_v$ the voltage increases.

Now relating the three regions of FIGS. 3 and 4 to the operation of the circuit of FIG. 1, when the tunnel diode 34 is in region A of FIG. 4 the potential across the tunnel diode 34 is such that the transistor 26 is maintained in a non-conductive state. The peak voltage $V_p$, as shown by the curve 118, is insufficient to bias the transistor 26 into conduction in the region A. The region B of the curve 118 is generally an unstable region, being the negative resistance region where the current from the terminal 12 decreases and the voltage developed between the terminals 12 and 14 decreases to a voltage $V_v$, and the transistor 26 is conducting. In the region C of the curve 118 the transistor 26 is biased into full conduction as the potential across the tunnel diode 34 is greater than the valley voltage $V_v$, which voltage is sufficient to maintain the transistor in full conduction.

Now that the characteristic curve 118 developed by the negative resistance circuit 10 has been explained, the bistable operation of the circuit of FIG. 1 will be explained. First, consider that the negative resistance circuit 10 is stabilized at an operating point 125 in region C thus applying a voltage $V_1$ to the lead 50 as indicated by the waveform 54 because the transitor 26 is biased into conduction in the region C. During the absence of a trigger pulse, the load condition of the circuit 10 is shown by a load line 126 having a zero current level at a voltage $V_s$ which is the stable state voltage. Upon the application of a negative trigger pulse 122 of the wave form 48 having a value $V_{T2}$ to the lead 28, the load line 126 temporarily shifts to the position of a load line 128. Thus the condition of the negative resistance circuit 10 shifts to the only existing stable state at a point 130 during the presence of the negative pulse 122. Upon the termination of the negative pulse 122 the condition of the negative resistance circuit 10 shifts along the curve 118 to a point 131 as the load line 126 is restored. Thus, a voltage $V_2$, as shown by the waveform 54, is applied to the lead 50 because the transistor 26 is biased in a non-conductive state in the region A.

When it is desired to change the state of the circuit 10 from the state at the point 131, a positive pulse 132 having a value $V_{T1}$ is applied from the source 44 to the lead 28 to cause the load line 126 to temporarily shift to a load line 134. Under this condition the operating state of the negative resistance circuit 10 shifts from the point 131 to a point 135 which is the only stable condition present in the circuit 10. Upon the termination of the positive pulse 132, the load line 134 shifts back to the position of the load line 126 and the state of the circuit 10 shifts to the point 125. In the stable state at the point 125 as shown by the waveform 54, the voltage applied to the lead 50 is again $V_1$. Thus, in the state at the point 125, the transistor 26 is conducting heavily and in the state at the point 131 the transistor 26 is biased out of conduction because of the low potential developed across the tunnel diode 34. It is to be noted that because of the short duration of the trigger pulses of the waveform 48 and the high speed operation of the circuit of FIG. 1, the voltage of the waveform 54 instantaneously changes level.

The addition of the battery 38 and the resistor 40 as a bias source provides improved operation of the circuit of FIG. 1. As a result of the positive potential of the batery 38, the curve 106 of FIG. 3 is shifted downward to the position shown, thus greatly reducing the valley current $I_v$. It is to be noted that the current $I_{BIAS}$ resulting from the battery 38 and the resistor 40 is indicated by the extension of the curve 106 below the horizontal axis of FIG. 3. By applying this bias from the battery 38 to the point 30, the operation of the bistable circuit becomes more efficient when the transistor 26 is biased in conduction because the voltage $V_1$ at point 125 decreases. Also, when the transistor 26 is biased out of conduction, the efficiency of the bistable circuit is increased by reducing the current utilized because the size of the resistor 32 may be increased in the circuit. A portion of the current flowing through the tunnel diode 34 and at the base of the transistor 26 is supplied from the battery 38 rather than all of the current being supplied from the battery 18. Thus, the negative resistance circuit 10 operates to develop an N-type resistance characteristic in response to the potential applied to the terminals 12 and 14 and the signals applied to the lead 28 from the source of trigger pulses 44. The negative resistance circuit 10 provides an efficient bistable circuit having a fast response time.

Figure 5:
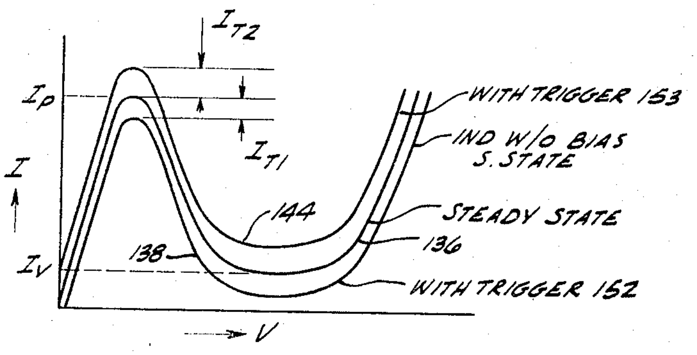
FIG. 5 is a graph of current versus voltage showing the variation of the characteristics of the tunnel diode of FIG. 2 in response to trigger signals.
Figure 6:
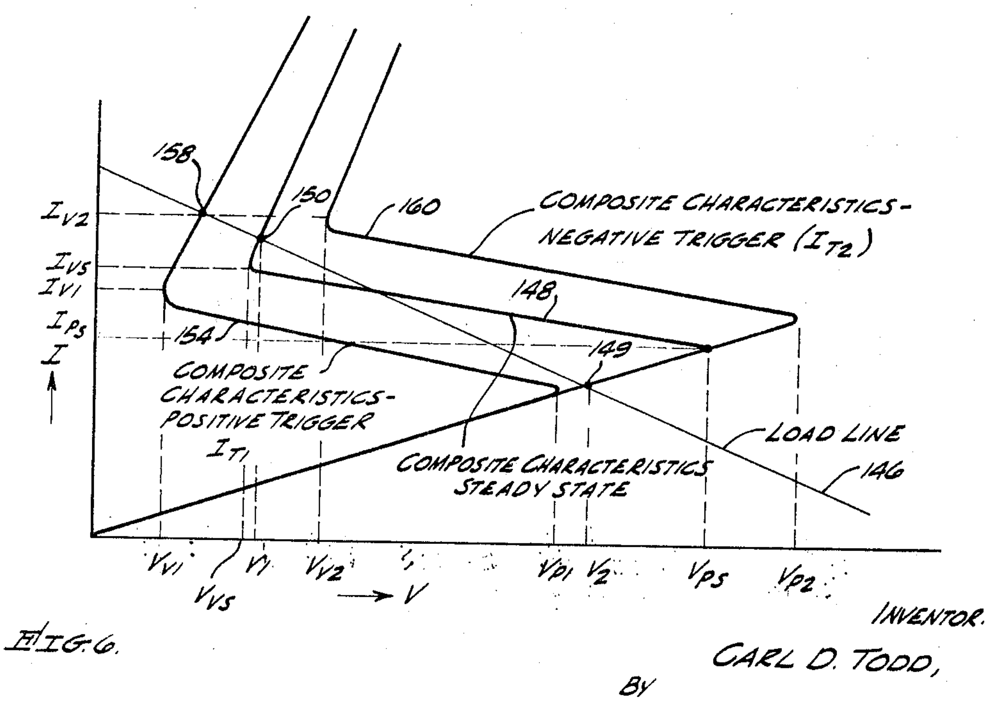
FIG. 6 is a graph of current versus voltage showing the operating characteristics of the bistable circuit of FIG. 2.

The operation of the bistable circuit of FIG. 2 will be further explained in relation to FIG. 5 showing the S-type characteristics of the tunnel diode 88 and in relation to FIG. 6 showing the operation of the bistable circuit. The bistable circuit of FIG. 2 is similar to FIG. 1 except that the source of trigger pulses 92 is applied to the third terminal 62 instead of to one of the two input terminals. A curve 136 shows the operating characteristics of the tunnel diode 88 under steady state conditions. A curve 138 shows the operating characteristics of the tunnel diode 88 during the presence of a positive current trigger 152 of the waveform 90 a value $I_{T1}$ causing the peak current $I_p$ and the valley current $I_v$ of the curve 136 to decrease in value. Also, during the presence of a negative current trigger 153 having a value $I_{T2}$ the characteristic of tunnel diode 88 shifts upward as shown by a curve 144 so that the peak current $I_p$ and the valley current $I_v$ are both increased. Thus, it can be seen that by applying current pulses to the lead 86 the tunnel diode temporarily shifts its characteristic. It is to be noted that the current versus voltage characteristic curve for the emitter to base of the transistor 72 may be combined with the curves of FIG. 5 as in FIG. 3.

Considering the overall characteristics of the negative resistance circuit 56 operating in the bistable circuit of FIG. 2, a constant load line 146 is maintained rather than a load line that varies in response to trigger pulses as explained in reference to FIG. 1. The load line 146 is established primarily by the value $R_L$ of the resistor 68. The steady state composite characteristics of the negative resistance circuit 56 are shown by an N-type curve 148 which has a steady state valley voltage $V_{vs}$ and a steady state peak voltage $V_{ps}$. When the negative resistance circuit 56 has the characteristics of the curve 148, the circuit of FIG. 2 has a first stable state at a point 149 and a second stable state at a point 150. For purposes of explanation, assume that the negative resistance circuit 56 is in the state at the point 149 with a voltage $V_2$ indicated by the waveform 100 of FIG. 2 as a result of the transistor 72 being biased out of conduction. Upon occurrence of a positive trigger pulse 152 the composite characteristic shifts to that shown by a curve 154 having a decreased valley voltage $V_{v1}$ and peak voltage $V_{p1}$ because of the current supplied by the pulse 152. The negative resistance circuit 56 changes state from point 149 to a point 158 as this is the only stable state present under this temporary condition. Upon removal of the positive pulse 152 the characteristic changes back to the curve 148 and the operating point of the circuit 56 follows the load line to the stable point 150. In the stable state of the point 150, the transistor 72 is biased into conduction and the voltage $V_1$ as shown by the waveform 100 is maintained at the output lead 102. It is to be noted that the positive pulse 152 increases the current to the tunnel diode 88 so as to decrease the peak current as indicated by the curve 138 of FIG. 5. This condition causes the peak voltage $V_{v1}$ of curve 154 to shift to a lower temporary state and to lower the peak voltage $V_{p1}$ so as to change the system to the point 158.

Upon the occurrence of a negative current pulse 153, the composite characteristic changes to a curve 160 having a valley voltage $V_{v2}$ and peak voltage $V_{p2}$. Under this condition the only stable state is approximately at the point 149 where the load line crosses the characteristic curve 160. Thus the operating point during the presence of the negative pulse 153 changes to the point 149. At the termination of the pulse 153 the operating point remains at the stable point 149 as the characteristic changes to the conditions shown by the curve 148. Thus the voltage $V_2$ of the waveform 100 is applied to the output lead 102 as the transistor 72 is biased out of conduction. Because of the short duration of the trigger pulses of the waveform 90 and the fast response of the circuit of FIG. 2, the voltage of the waveform 100 instantaneously changes levels.

The inductor 84 which has the purpose of isolation of the input impedance of the transistor 72, conventionally having a large capacitance value between base and emitter, greatly improves the operation of the system without introducing substantial ringing thereto. The source of bias potential including the battery 96 and the resistor 98 has the advantage of increasing the switching efficiency as discussed in relation to the circuit of FIG. 1. The advantage of the circuit of FIG. 2 having a trigger point at the junction 86 is to fully utilize the high-speed response of the tunnel diode 88. By applying the trigger pulse directly to the tunnel diode 88, a relatively low trigger voltage and one of relatively short duration is sufficient to trigger the circuit to its opposite state. Thus the bistable circuit of FIG. 2 operates with a relatively constant load line to shift the peak voltage to a low level during the presence of a positive pulse, and to increase the valley voltage to a high level during the presence of a negative pulse so that the operating state of the negative resistance circuit 56 shifts from one point to the other. The peak current of the tunnel diode 88 when combined with an emitter to base current characteristic curve of the transistor 72 determines the peak voltage of the composite characteristic of the curves 148, 154 and 160. Also the valley current of the tunnel diode when combined with the characteristic curve of the base to emitter of the transistor 72 determines the valley voltage of the characteristics of the curves 148, 154 and 160. Valley voltage is also a function of the current gain of the transistor 72. Thus, because the bistable circuit of FIG. 2 operates directly on the characteristic of the tunnel diode 88 to change a composite characteristic rather than to vary the load line, a much smaller voltage or current signal will provide triggering from one state to the other.

Thus there has been described a bistable circuit that includes a highly improved negative resistance circuit that develops an N-type voltage versus current characteristic. The circuit is highly simplified by utilizing a single transistor and a tunnel diode, which diode characteristically has an S-type characteristic. In the first triggering arrangement which has essentially two terminals, the trigger signal varies the load line to cause the change of operating conditions from one state to the other. In the second arrangement, which is essentially a three terminal device, the trigger signals are applied directly to the tunnel diode 88 so as to effectively vary the characteristics thereof while maintaining a constant load line. Thus, in this second arrangement trigger pulses of lower amplitude are sufficient and higher triggering speed is obtained than in the first arrangement. However, in both arrangements a relatively high trigger speed is obtained because of fast response of the tunnel diode. A variation of both arrangements is to provide a bias source to the tunnel diode to increase the efficiency of the switching operation. However, it is to be noted that this biasing arrangement is not essential for the basic operation of the circuit. Thus, a current stable characteristic is developed by the negative resistance circuits of this invention that may be widely used in many types of circuits including bistable circuits and relaxation oscillators, for example.

What is claimed is:

1. A bistable circuit comprising a source of potential including an impedance element and having a first and second terminal, a resistor having a first and a second end with the first end coupled to said first terminal, a tunnel diode coupled between the second end of said resistor and said second terminal, a transistor having a first and a second electrode coupled between said first and second terminals and having a base coupled to the second end of said resistor, a source of current coupled to the second end of said resistor, and a source of trigger pulses of alternate first and second polarity coupled to the first electrode of said transistor for controlling said tunnel diode to render said transistor respectively conductive and non-conductive.

2. A bistable circuit comprising a source of potential having a first and a second terminal and including a load impedance, a transistor having a first and a second electrode coupled between said first and second terminals and having a base electrode, a resistor having a first and a second end with the first end coupled to said first terminal and the second end coupled to said base electrode, an inductor having a first and second end with the first end coupled to the second end of said resistor, a tunnel diode having a first end coupled to said second end of said inductor and a second end coupled to said second terminal, and a source of trigger pulses coupled to the first end of said tunnel diode for applying trigger pulses of alternate first and second polarity thereto to respectively render said transistor conductive and non-conductive.

3. A bistable circuit comprising a source of potential, a first resistor having a first end coupled to said source of potential, a transistor having a first electrode coupled to a second end of said first resistor and a second electrode coupled to said source of potential and having a base, a second resistor having a first end coupled to the second end of said first resistor and a second end coupled to the base of said transistor, a current source coupled between said source of potential and the second end of said second resistor, a tunnel diode having an anode coupled to the second end of said second resistor and a cathode coupled to said source of potential, output circuit means coupled to said first electrode of said transistor, and a source of trigger pulses coupled to the anode of said tunnel diode for applying trigger pulses of alternate first and second polarity thereto to render said transistor conductive and non-conductive and to respectively apply a first and a second potential to said output circuit means.

4. A circuit for providing a current stable negative resistance between first and second terminals comprising: a transistor having a first electrode connected directly to said first terminal, a second electrode connected directly to said second terminal, and a base electrode; a resistor connected directly between said first electrode and said base electrode; a tunnel diode connected between said base electrode and said second electrode; and bias and load means connected in series between said first and second electrodes.

5. A circuit according to claim 4 including further bias means coupled to said tunnel diode for reducing the magnitude of the valley current of said tunnel diode.

6. A circuit for providing a current stable negative resistance between first and second terminals comprising: a transistor having a first electrode connected directly to said first terminal, a second electrode connected directly to said second terminal, and a base electrode; a resistor connected directly between said first electrode and said base electrode; inductive means and a tunnel diode connected in series between said base electrode and said second electrode; and bias and load means connected in series between said first and second electrodes.

7. A circuit for providing a current stable negative resistance between first and second terminals comprising: a transistor having its collector electrode connected directly to said first terminal and its emitter electrode connected directly to said second terminal, a feedback impedance coupled between the collector and base electrodes of said transistor, a tunnel diode coupled between the emitter and base electrodes of said transistor, and load and bias means coupled in series between said first and second terminals.

References Cited by the Examiner

UNITED STATES PATENTS

| | | | |
|---|---|---|---|
| 2,995,664 | 8/1961 | Deuitch | 307—88.5 |
| 3,102,209 | 8/1963 | Pressman | 328—37 |
| 3,229,113 | 1/1966 | Wells | 307—88.5 |

OTHER REFERENCES

Article from Electronic Equipment Engineering, May 1960 (published by Gen. Elec.), 8 pages, "Tunnel Diodes as Amplifiers and Switches," Sylvan et al.

ARTHUR GAUSS, *Primary Examiner.*

JOHN W. HUCKERT, GEORGE N. WESTBY, *Examiners.*

J. BUSCH, R. LAKE, *Assistant Examiners.*

UNITED STATES PATENT OFFICE
CERTIFICATE OF CORRECTION

Patent No. 3,320,433 May 16, 1967

Carl David Todd

It is hereby certified that error appears in the above numbered patent requiring correction and that the said Letters Patent should read as corrected below.

In the drawing "FIG. 1" the lead line from the waveform 48 should touch the arrowed lead between the pulse source 44 and the capacitor 46 rather than the lead between the capacitor 46 and the collector of the transistor 26; column 1, line 25, for "valve" read -- value --; line 57, after "is" insert -- a --; column 3, line 8, for "provide" read -- provided --; column 4, line 56, for "transstor" read -- transistor --; column 5, line 20, for "batery" read -- battery --; line 54, after "90" insert -- having --.

Signed and sealed this 28th day of November 1967.

(SEAL)
Attest:

EDWARD M. FLETCHER, JR.
Attesting Officer

EDWARD J. BRENNER
Commissioner of Patents